(12) United States Patent
West et al.

(10) Patent No.: US 11,881,449 B2
(45) Date of Patent: Jan. 23, 2024

(54) HIGH PERFORMANCE HIGH VOLTAGE ISOLATORS

(71) Applicant: Texas Instruments Incorporated, Dallas, TX (US)

(72) Inventors: Jeffrey Alan West, Dallas, TX (US); Thomas Dyer Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 502 days.

(21) Appl. No.: 16/916,748

(22) Filed: Jun. 30, 2020

(65) Prior Publication Data

US 2021/0020564 A1 Jan. 21, 2021

Related U.S. Application Data

(60) Provisional application No. 62/876,152, filed on Jul. 19, 2019.

(51) Int. Cl.
*H01L 23/522* (2006.01)
*H01L 23/58* (2006.01)
*H01L 23/64* (2006.01)
*H01L 27/01* (2006.01)

(52) U.S. Cl.
CPC ...... *H01L 23/5223* (2013.01); *H01L 23/5227* (2013.01); *H01L 23/585* (2013.01)

(58) Field of Classification Search
CPC ............ H01L 23/5223; H01L 23/5227; H01L 23/585; H01L 23/642; H01L 23/645; H01L 27/016; H01L 28/10; H01L 28/60
See application file for complete search history.

(56) References Cited

U.S. PATENT DOCUMENTS

| | | | |
|---|---|---|---|
| 9,299,697 B2 | 3/2016 | West et al. | |
| 10,186,576 B2 | 1/2019 | Selvaraj et al. | |
| 2005/0215022 A1* | 9/2005 | Adam | H01L 21/823462 257/E21.625 |
| 2011/0115073 A1* | 5/2011 | Chen | H01L 24/05 257/E21.59 |
| 2014/0145297 A1* | 5/2014 | Daamen | H01L 23/5223 438/386 |
| 2015/0333055 A1* | 11/2015 | West | H01L 28/60 257/306 |
| 2016/0225729 A1* | 8/2016 | Chen | H01L 24/05 |

(Continued)

OTHER PUBLICATIONS

EPO Search Report, 3 pages, dated Aug. 17, 2022.

*Primary Examiner* — Omar F Mojaddedi
(74) *Attorney, Agent, or Firm* — Andrew R. Ralston; Frank D. Cimino

(57) ABSTRACT

An integrated circuit includes a semiconductor substrate and a plurality of dielectric layers over the semiconductor substrate, including a top dielectric layer. A metal plate or metal coil is located over the top dielectric layer; a metal ring is located over the top dielectric layer and substantially surrounds the metal plate or metal coil. A protective overcoat overlies the metal ring and overlies the metal plate or metal coil. A trench opening is formed through the protective overcoat, with the trench opening exposing the top dielectric layer between the metal plate/coil and the metal ring, the trench opening substantially surrounding the metal plate or metal coil.

23 Claims, 14 Drawing Sheets

(56) References Cited

U.S. PATENT DOCUMENTS

2017/0141052 A1* 5/2017 Pan ...................... H01L 23/564
2018/0026095 A1* 1/2018 Selvaraj .............. H01L 23/5227
                                                           257/532
2019/0181086 A1* 6/2019 Ho ...................... H01L 23/5223

* cited by examiner

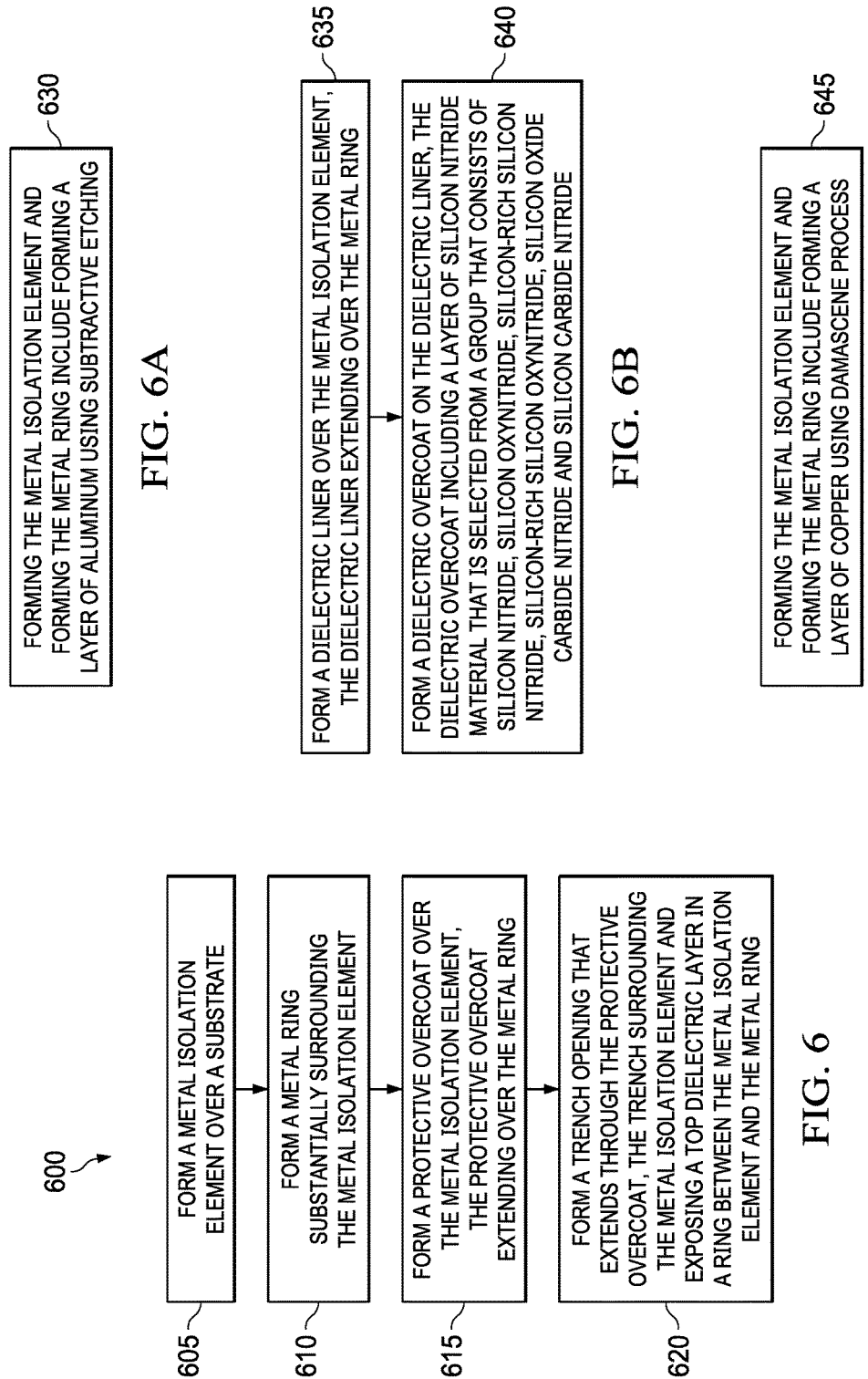

650 — FORM A DIELECTRIC LINER OVER THE METAL ISOLATION ELEMENT, THE DIELECTRIC LINER EXTENDING OVER THE METAL RING, THE DIELECTRIC OVERCOAT INCLUDING A SILICON NITRIDE MATERIAL THAT IS SELECTED FROM A GROUP THAT CONSISTS OF SILICON NITRIDE, SILICON OXYNITRIDE, SILICON-RICH SILICON NITRIDE, SILICON-RICH SILICON OXYNITRIDE, SILICON OXIDE CARBIDE NITRIDE AND SILICON CARBIDE NITRIDE

FIG. 6D

655 — FORM A DIELECTRIC OVERCOAT ON THE DIELECTRIC LINER

660 — FORM A LOWER METAL ISOLATION ELEMENT BETWEEN THE UPPER METAL ISOLATION ELEMENT AND THE SUBSTRATE

FIG. 6E

665 — EACH OF FORMING THE UPPER METAL ISOLATION ELEMENT AND FORMING THE LOWER METAL ISOLATION ELEMENT INCLUDES FORMING METAL PLATES

FIG. 6F

670 — EACH OF FORMING THE UPPER METAL ISOLATION ELEMENT AND FORMING THE LOWER METAL ISOLATION ELEMENT INCLUDES FORMING METAL COILS

FIG. 6G

675 — FORMING THE METAL RING INCLUDES CONDUCTIVELY COUPLING THE METAL RING TO THE SUBSTRATE

FIG. 6H

HIGH PERFORMANCE HIGH VOLTAGE ISOLATORS

PRIORITY UNDER 35 U.S.C. § 119(e) & 37 C.F.R. § 1.78

This non-provisional application claims priority based upon the following prior United States provisional patent application(s): (i) "HIGH-PERFORMANCE HIGH-VOLTAGE ISOLATORS," Application No.: 62/876,152, filed Jul. 19, 2019, in the name(s) of Jeffrey Alan West and Thomas Dyer Bonifield, which is hereby incorporated by reference in its entirety.

FIELD OF THE DISCLOSURE

Disclosed implementations relate generally to the field of semiconductor devices, and more particularly, but not exclusively, to reactive isolation devices, e.g. capacitive isolators and inductive isolators.

BACKGROUND

Some integrated circuits include an isolation device, e.g., a capacitor or transformer, formed in the interconnect levels. Such isolation devices may include a lower metal isolation element, e.g., a plate or coil, formed in a lower metal level, an upper metal isolation element formed in a higher metal level, and several dielectric layers between the upper metal element and the lower metal element. Such an isolation device may be used to isolate a higher voltage circuit from a lower voltage circuit, with the isolation device coupling a signal between the two circuits.

SUMMARY

Disclosed implementations provide an integrated circuit that includes an isolation device, e.g., a capacitor or transformer, which is designed to operate at high voltages, e.g., greater than 500 V. A protective overcoat, e.g., a dielectric liner and/or dielectric overcoat that is formed over the top metal level, includes a silicon nitride material, i.e., a material that contains both silicon and nitrogen. A trench opening is formed through the protective overcoat to protect against lateral discharge that can occur through the silicon nitride material during very high voltage transients. While such implementations may be expected to improve reliability of such integrated circuits employing the silicon nitride material, no particular result is a requirement of the described invention(s) unless explicitly recited in a particular claim.

In one aspect, an implementation of an integrated circuit is disclosed. The integrated circuit includes a semiconductor substrate; a plurality of dielectric layers over the semiconductor substrate, including a top dielectric layer a metal plate over the top dielectric layer; a metal ring over the top dielectric layer and substantially surrounding the metal plate; a protective overcoat overlying the metal ring and contacting overlying the metal plate; and a trench opening through the protective overcoat, the trench opening exposing the top dielectric layer between the metal plate and the metal ring, the trench opening substantially surrounding the metal plate.

In another aspect, an implementation of an integrated circuit is disclosed. The integrated circuit includes a semiconductor substrate; a plurality of dielectric layers over the semiconductor substrate, including a top dielectric layer; a metal coil located over the top dielectric layer; a metal ring located over the top dielectric layer and substantially surrounding the metal coil; a protective overcoat overlying the metal ring and overlying the metal coil; and a trench opening through the protective overcoat, the trench opening exposing the top dielectric layer between the metal coil and the metal ring, the trench opening substantially surrounding the metal coil.

In yet another aspect, an implementation of a process of forming an integrated circuit is disclosed. The process includes forming an upper metal isolation element over a substrate; forming a metal ring substantially surrounding the upper metal isolation element; forming a protective overcoat over the upper metal isolation element, the protective overcoat extending over the metal ring; and forming a trench opening that extends through the protective overcoat, the trench opening exposing a top dielectric layer in a ring between the upper metal isolation element and the metal ring, the trench opening surrounding the upper metal isolation element.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

FIG. 6 provides a flowchart that illustrates a process of forming an integrated circuit according to an implementation of the disclosure; and FIG. 6A through FIG. 6H define elements of FIG. 6 in greater detail.

DETAILED DESCRIPTION OF THE DRAWINGS

Figure 1A:
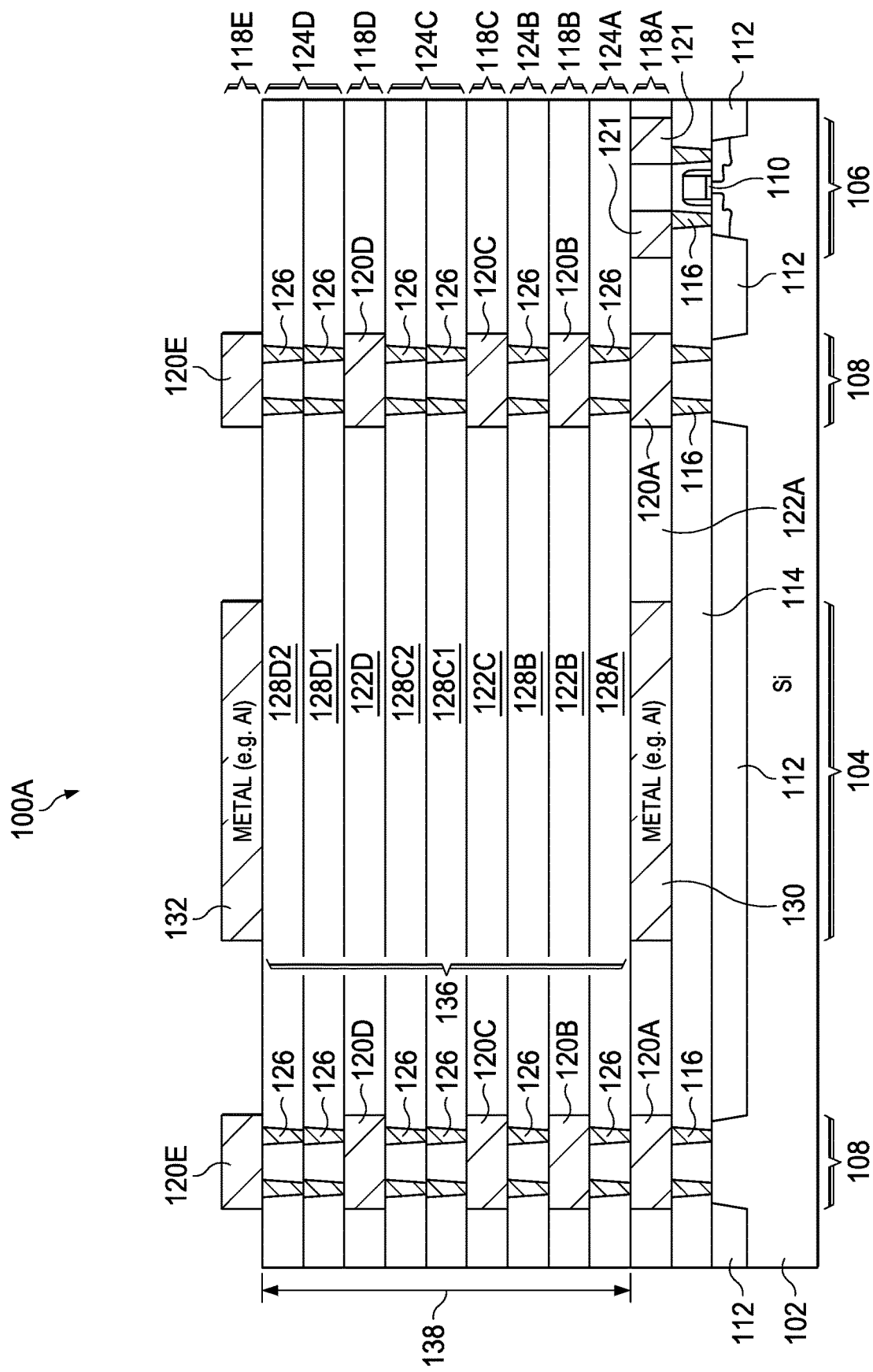
FIG. 1A through FIG. 1D illustrate section views of a galvanic isolation capacitor, depicted in successive stages of manufacturing according to an implementation of the disclosure.

Specific implementations of the invention will now be described in detail with reference to the accompanying figures. The figures are not drawn to scale and they are provided merely to illustrate the invention. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. The present invention is not limited by the illustrated ordering of acts or events, as some acts may occur in different orders and/or concurrently with other acts or events. Furthermore, not all illustrated acts or events are required to implement a methodology in accordance with the present invention.

Reference to relationships such as upper, lower, top, bottom, over, under, etc. should be understood to refer to the relationships as illustrated in the figures and should not be taken as absolute directions. Further, for the purposes of this application, reference to a "top dielectric layer" refers to either the top-most inter-level dielectric (ILD) layer or the top-most intra-metal dielectric (IMD) layer and does not refer to layers in a protective overcoat, e.g., a dielectric liner and/or dielectric overcoat.

When two electrical circuits operating in very different voltage domains need to communicate, galvanic isolation can be used to pass energy or information without unwanted current flowing between the two circuits. Galvanic isolation can also be used to prevent accidental current from reaching ground through a person's body. Two common forms of galvanic isolation are provided through capacitors and transformers.

The present application is directed to galvanic isolators, e.g., capacitors and transformers, which are designed to operate across high voltage differences, e.g., 500 V or more. During use of such galvanic isolators, a capacitor or transformer that is designed to have a working voltage, e.g., of 1,000-1,500 V, may need to withstand very quick transient voltages that are much higher, e.g., 10,000 V. It is in the presence of these transient voltages that weaknesses in the structure of the device may be discovered.

U.S. Pat. No. 9,299,697 (hereinafter the '697 patent), which is owned in common with the present application and which is hereby incorporated by reference, teaches that while certain dielectric materials do not generally carry a current, in the presence of very high transient voltages, a layer formed of these dielectric materials may act as a conductor and allow lateral discharge between a high-voltage element and a low-voltage element in an integrated circuit, resulting in destruction of the chip.

The formation of galvanic isolators traditionally relies heavily on silicon oxide (SiO2) and SiO2-related materials, with silicon nitride and silicon nitride-related materials used in lesser amounts. Depending on process conditions, these silicon nitride-related materials are typically non-stoichiometric compositions between SiN and Si3N4. Because of the known variations in compositions, for the purposes of this application, reference to silicon nitride and the notation SiN are used to refer to any dielectric that is substantially comprised of silicon and nitrogen. Similarly, the terms "silicon nitride-related" material and "SiN-related" material are defined as any material containing both silicon and nitrogen, with or without other components. Thus, a silicon nitride-related material can include silicon nitride, silicon oxynitride, silicon-rich silicon nitride, silicon-rich silicon oxynitride, silicon oxide carbide nitride, silicon carbide nitride, etc. The inventors have noted that when an SiN-related material is either in contact with or in close proximity to the top metal element of a galvanic isolator, e.g., the top metal plate of a galvanic isolation capacitor or the top metal coil of a galvanic isolation transformer, very high transient voltages may cause lateral discharge across the integrated circuit by passing through the SiN-related material.

To decrease the risk of lateral discharge, a trench opening can be formed between the top metal element of the galvanic isolator and a low-voltage element on the same metal level, with the trench opening extending through the SiN-related dielectric layer. While the '697 patent was specifically directed to a dielectric layer directly below the upper plate of a high-voltage capacitor, the present disclosure extends this concept to other dielectric layers that may lie over a galvanic isolator element and to dielectric layers that may not directly touch the galvanic isolator element but are in proximity to the galvanic isolator element.

FIG. 1A through FIG. 1D illustrate a microelectronic device 100 that contains a galvanic isolation element, e.g., a galvanic isolation capacitor, at a succession of late stages of manufacturing that occur after formation of the metal layers. In one implementation, the microelectronic device 100 can be an integrated circuit (IC) or IC chip. The microelectronic device 100 is a 5-level metal (5LM) device, the metal including, e.g. aluminum (Al), which is formed by subtractive etch. Top-level metal structures in the microelectronic device 100 include a top metal plate 132 configured to operate at high voltage relative to the remainder of the microelectronic device 100. The top metal plate 132 is located on a top-level ILD 128D2, which may contain, e.g., silicon dioxide; the top metal plate 132 is substantially surrounded by a metal ring configured to operate at a low voltage, e.g. ground. In this context, "substantially surrounded" means that the metal ring, or similar feature, forms a path that encompasses at least 180° of arc around the surrounded feature. The path need not have a constant distance to the surrounded feature, and may surround more than one surrounded feature. In some examples the metal ring may encompass at least 270° degrees of arc, may nearly completely (>345° of arc) or may form a closed loop around the feature. In some examples it may be preferable to for a closed loop (360° of arc) when surrounding a feature, but in some cases protection of the feature may be provided with less than 360° of arc.

Aluminum used in integrated circuit interconnects may include a small amount of copper, e.g. about 1-5%, e.g. to reduce the effects of electromigration. Herein, such a concentration of copper is considered negligible, and is by definition considered to be absent from such interconnects. Thus, an aluminum layer, or structures formed from an aluminum layer, that is alloyed with such a negligible amount of copper by definition does not "include" copper.

FIG. 1A is a cross section schematic of a microelectronic device 100A containing a high voltage component. In the instant example, the microelectronic device 100A is described as an integrated circuit; other configurations of the microelectronic device 100A, such as a standalone component or a hybrid circuit, are within the scope of the instant example.

The microelectronic device 100A is formed on a semiconductor substrate 102, e.g., a silicon wafer. The microelectronic device 100A includes the high-voltage component and may also include a low-voltage component. In the illustrated implementation of the microelectronic device 100A, the high-voltage component is shown as a galvanic isolation capacitor 104 and the low-voltage component is shown as a metal oxide semiconductor (MOS) transistor 106, although other high-voltage components and low-voltage components are within the scope of this disclosure. In one implementation, the MOS transistor 106 operates at 24 volts or less and has a gate dielectric layer 110 that is less than 70 nanometers thick. The microelectronic device 100A may also include a ground ring 108, also known as a faraday cage, which surrounds the galvanic isolation capacitor 104. The ground ring 108 will be further explained below.

A field oxide or trench isolation 112 may be formed in the semiconductor substrate 102 (e.g., near or adjacent to a top surface of the substrate) to laterally isolate elements of the microelectronic device 100A. A pre-metal dielectric (PMD) layer 114 is formed over the semiconductor substrate 102 including any of the field oxide (FOX) layers or trench isolation regions 112 formed prior to the deposition of subsequent metal levels 118. Contacts 116 are disposed through the PMD layer 114 to provide conductive electrical connections for the MOS transistor 106 and for the ground ring 108, as well as other components or circuit portions (not specifically shown in FIG. 1A) of the microelectronic device 100A.

Multiple metal levels 118 are disposed over the PMD layer 114. The metal levels 118 include metal interconnects 121 connected to the MOS transistor 106 and a series of metal rings 120, as well as to any additional components, devices or circuit portions. In the metal levels 118, IMD layers 122, which in one implementation are of silicon dioxide-based dielectric material, are disposed between the metal rings 120 and the metal interconnects 121. Respective via levels 124 are disposed between the metal levels 118. The via levels 124 may include metal vias 126 connecting the metal rings 120. The series of metal rings 120 and respective metal vias 126 are coupled together and to the semiconductor substrate 102 through the respective contacts 116 to form the ground ring 108. The ground ring 108 thus forms a low-voltage component around the high-voltage top metal plate 132.

In each via level 124, the metal vias 126 are disposed through ILD layers 128, which in one implementation are of silicon dioxide-based dielectric material. Other dielectric materials for the IMD layers 122 and the ILD layers 128, such as low-k materials, are within the scope of the instant example. In one implementation, one or more of the IMD layers 122 may be part of the corresponding ILD layers 128, depending on the process sequence used to form the metal levels 118.

A low-voltage node of the galvanic isolation capacitor 104, depicted as a bottom metal plate 130, is disposed in one of the metal levels 118, e.g., a first metal level 118A as depicted in FIG. 1A. A high-voltage node of the galvanic isolation capacitor 104, depicted as a top metal plate 132, is disposed in another metal level, e.g., a top metal level 118E as depicted in FIG. 1A. Top metal plate 132 is in contact with the top dielectric layer, which in the implementation shown is a sixth ILD layer 128D2. A first ILD layer 128A, a second IMD layer 122B, a second ILD layer 128B, a third IMD layer 122C, a third ILD layer 128C1, a fourth ILD layer 128C2, a fourth IMD layer 122D, a fifth ILD layer 128D1, and a sixth ILD layer 128D2, each of which is formed between the bottom metal plate 130 and the top metal plate 132, provide a capacitor dielectric 136 of the galvanic isolation capacitor 104. A thickness 138 of the capacitor dielectric 136 may be determined by a desired operating voltage of the top metal plate 132 relative to the bottom metal plate 130 and/or the semiconductor substrate 102. The thickness 138 of the capacitor dielectric 136 is at least 2 microns; in one example in which the galvanic isolation capacitor 104 is designed to operate at a differential of 1000 volts, the capacitor dielectric 136 may have a thickness 138 of about 14-18 microns.

Figure 1B:
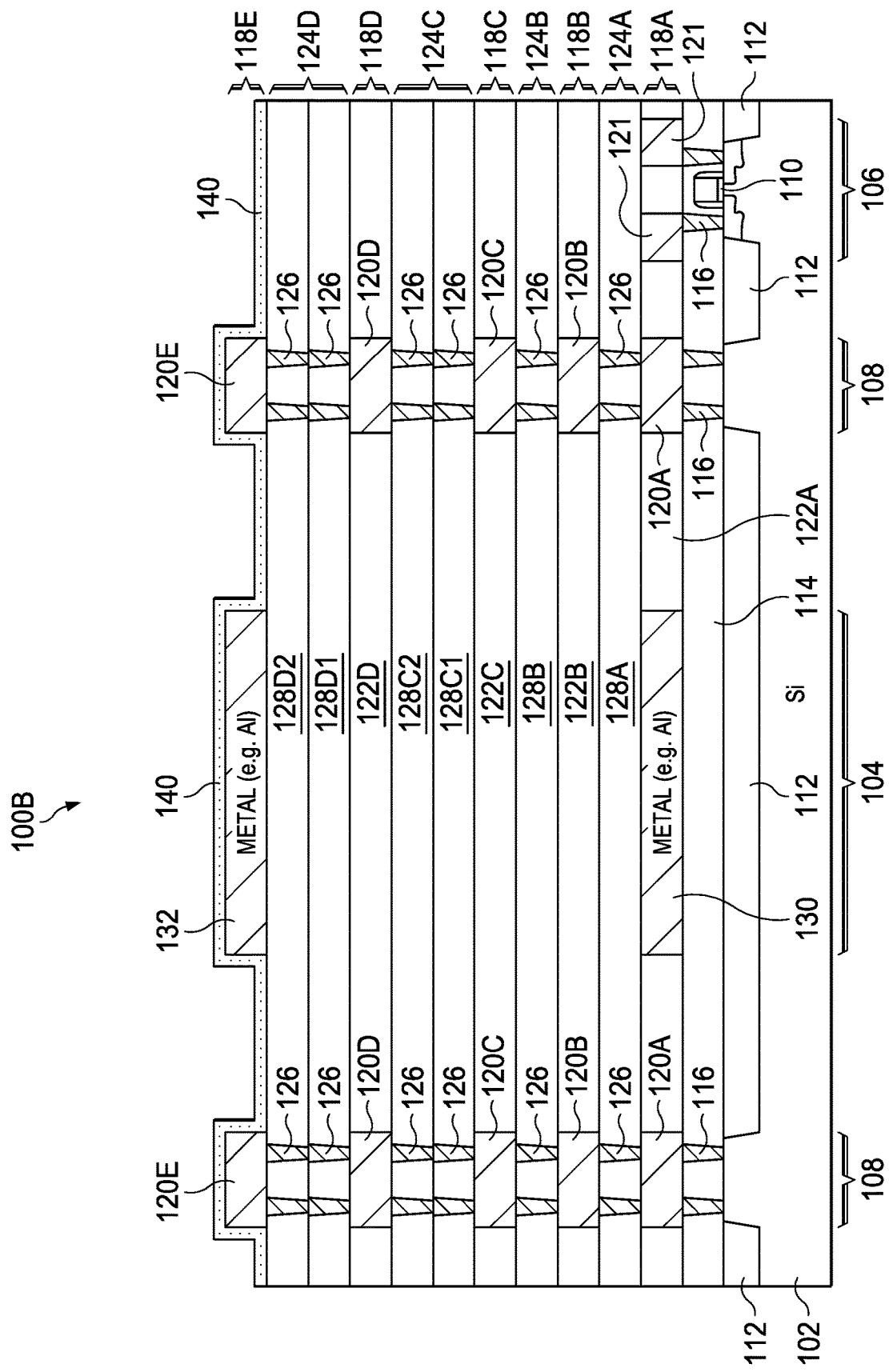

FIG. 1B illustrates a section view of a microelectronic device 100B on which a dielectric liner 140 has been formed over the microelectronic device 100A. The dielectric liner 140 is formed over the top-level metal, e.g., the top metal plate 132, a top-most metal ring 120E, and exposed portions of the top dielectric layer, i.e., the sixth ILD layer 128D2. In one implementation, the dielectric liner 140 includes, e.g., SiO2.

Figure 1C:
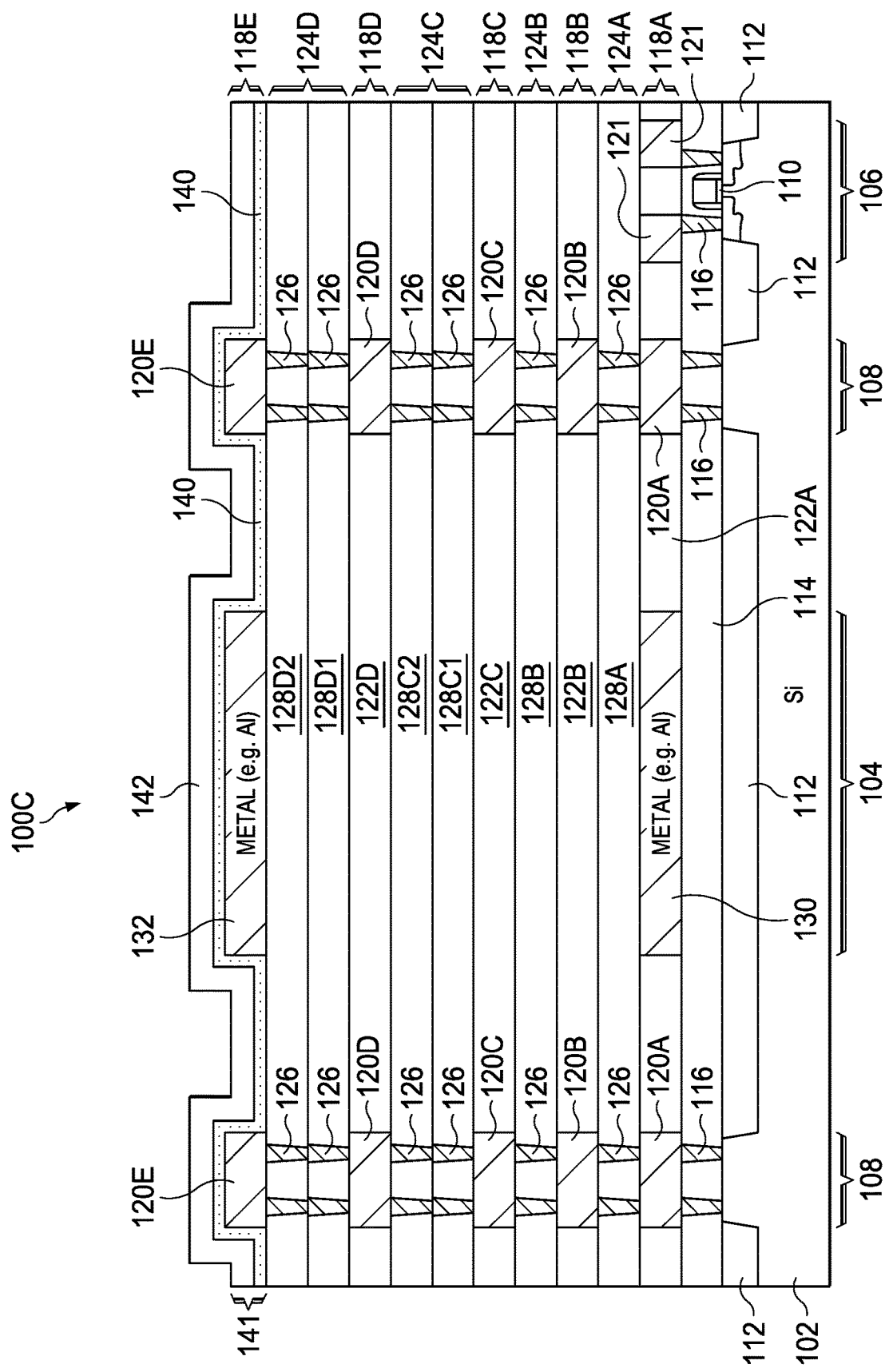

FIG. 1C illustrates a section view of a microelectronic device 100C after a dielectric overcoat 142 is formed over the dielectric liner 140 of the microelectronic device 100B. In one implementation the dielectric overcoat 142 includes an SiN-related material, e.g., silicon nitride, silicon oxynitride, silicon-rich silicon nitride, silicon-rich silicon oxynitride, silicon oxide carbide nitride and silicon carbide nitride. Together the dielectric liner 140 and the dielectric overcoat 142 form a protective overcoat 141 over the top metal plate 132 and the top-most metal ring 120E of the ground ring 108. The protective overcoat 141 can range between 500 nanometers and 5 microns in thickness.

Figure 1D:
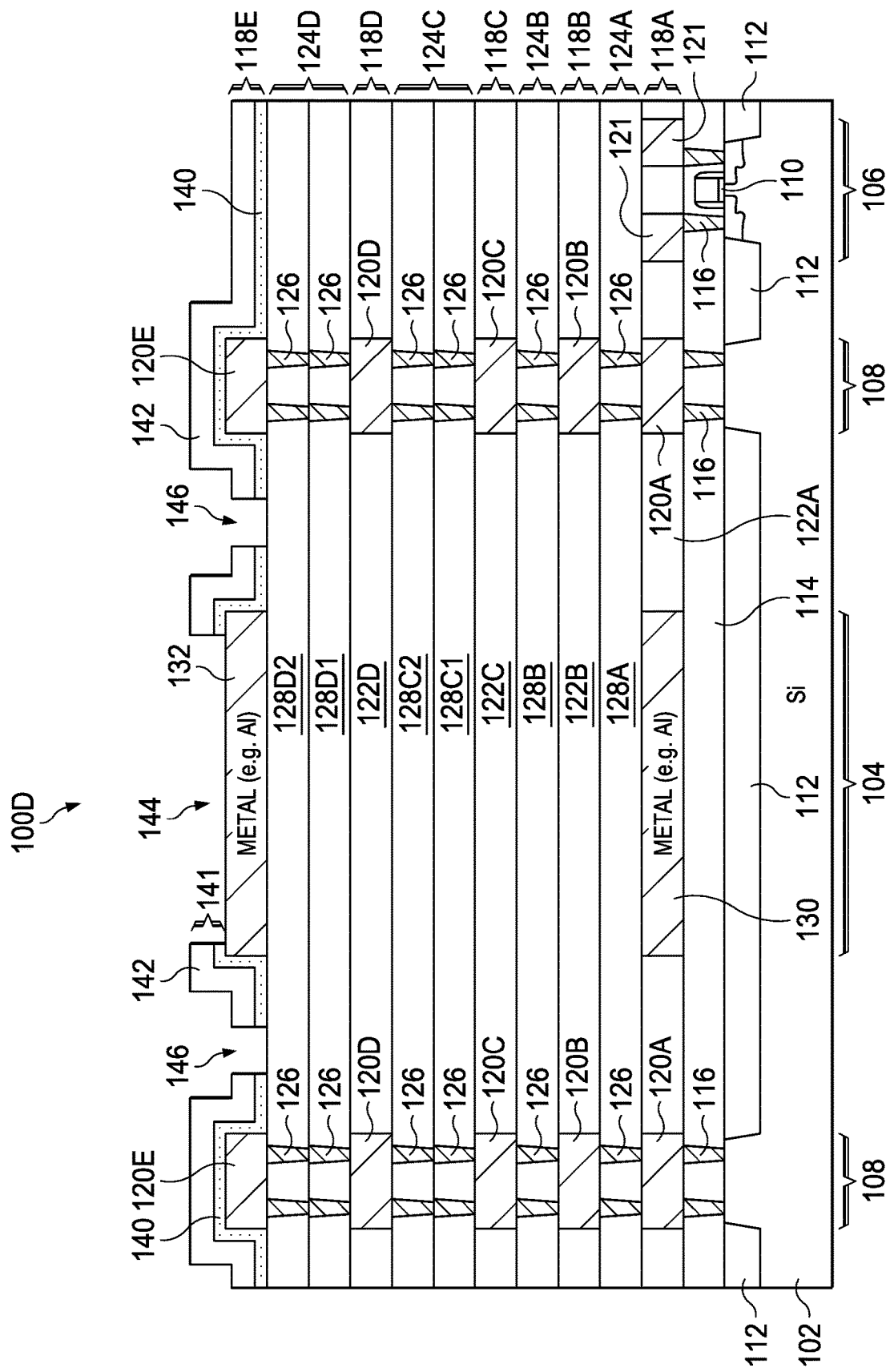

FIG. 1D illustrates a section view of a microelectronic device 100D after the formation of a contact opening 144 and a trench opening 146. The contact opening 144 extends through the protective overcoat 141, e.g., the dielectric overcoat 142 and the dielectric liner 140, and exposes at least a portion of the top metal plate 132. The trench opening 146 also extends through the protective overcoat 141 to expose the sixth ILD layer 128D2; the trench opening 146 also substantially surrounds the top metal plate 132 and isolates the top metal plate 132 from a lateral path to the top-most metal ring 120E through the dielectric overcoat 142. It can be noted that because the contact opening 144 and the trench opening 146 are generally formed at the same time, the trench opening 146 extends through both the dielectric liner 140 and the dielectric overcoat 142 to contact the sixth ILD layer 128D2. However, in a production flow that allowed the trench opening 146 to be formed at a different time than the contact opening 144, forming the trench opening 146 only through the dielectric overcoat 142 would serve the desired goal of isolating top metal plate 132 from the top-most metal ring 120E.

FIGS. 2A through 2D illustrate a microelectronic device 200 at a succession of late stages of manufacturing, e.g., after formation of the metal layers. In one implementation, microelectronic device 200 is an IC or IC chip. In this example the microelectronic device 200 is again a 5-level metal (5LM) device containing a galvanic isolation capacitor, but here the metal includes, e.g., copper (Cu), which is formed by a damascene process. Copper can migrate through a dielectric such silicon dioxide; therefore, although not specifically shown in the microelectronic device 200, copper trenches/vias typically have a diffusion barrier liner, e.g., tantalum nitride. Top-level metal structures in the microelectronic device 200 include a top metal plate 232 configured to operate at high voltage relative to the remainder of the microelectronic device 200. The top metal plate 232 is located within a top-level IMD, which here is a fifth IMD layer 222E, and in contact with a top-level ILD, here a fourth ILD layer 228D. The fifth IMD layer 222E is formed, e.g. of silicon dioxide, and is substantially surrounded by a ground ring 208 that is configured to operate at a low voltage, e.g. ground.

Figure 2A:
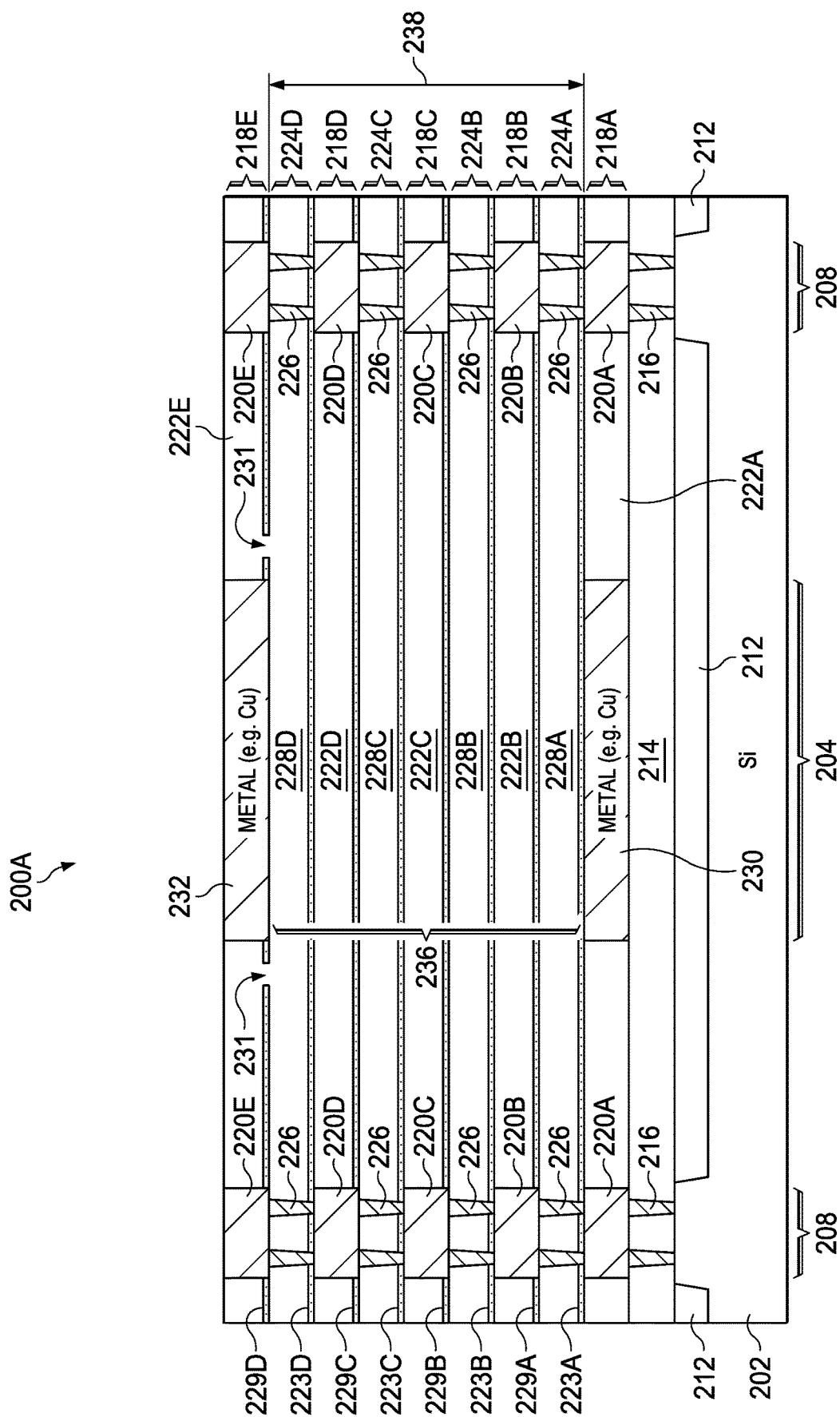
FIG. 2A through FIG. 2D illustrate section views of a galvanic isolation capacitor, depicted in successive stages of manufacturing according to an implementation of the disclosure.

FIG. 2A provides a section view of an example microelectronic device 200A, e.g., a standalone component, that contains a high voltage component that can be a galvanic isolation capacitor. Other configurations of the microelectronic device 200A, such as an integrated circuit or a hybrid circuit, are within the scope of the instant example. The microelectronic device 200A is formed on a semiconductor substrate 202, which in one implementation is a silicon wafer. The high-voltage component is again shown as a galvanic isolation capacitor 204, although other high-voltage components are within the scope of this disclosure. The microelectronic device 200A may also include a ground ring 208, which substantially surrounds the galvanic isolation capacitor 204, as further noted below.

A FOX or trench isolation 212 may be formed in the semiconductor substrate 202 (e.g., near or adjacent to a top surface of the substrate) to laterally isolate elements of the microelectronic device 200A. A pre-metal dielectric (PMD) layer 214 is formed over the semiconductor substrate 202 including any FOX layer or trench isolation regions 212 formed prior to the deposition of the subsequent metal levels 218. Contacts 216 are disposed through the PMD layer 214 to provide electrical connections for the ground ring 208.

Metal levels 218 are disposed over the PMD layer 214 and include a series of metal rings 220 that circumscribe one or more high-voltage components. In each metal level 218, IMD layers 222, which in one implementation are of silicon dioxide-based dielectric material, are disposed between the metal rings 220. Each of a first metal level 218A, a second metal level 218B, a third metal level 218C, and a fourth metal level 218D have a respective IMD cap layer 223 overlying the IMD layer 222 and the included metal elements, e.g., the metal rings 220 and any other included metallization. The IMD cap layers 223 can provide a barrier to migration of the copper and may also serve as an etch stop layer during processing of the microelectronic device 200. Respective via levels 224 are disposed between the metal levels 218 and include the metal vias 226 connecting the metal rings 220. The series of metal rings 220 and respective metal vias 226 are coupled together and to the semiconductor substrate 202 through respective contacts 216 to form the ground ring 208. The ground ring 208 thus forms a low-voltage component around the high-voltage top metal plate 232.

In each via level 224, the metal vias 226 are disposed through the ILD layers 228, which in one implementation are of silicon dioxide-based dielectric material. Other dielectric materials for the IMD layers 222 and the ILD layers 228, such as low-k materials, are within the scope of the instant example. In the implementation shown, the ILD layers 228 each have a respective ILD cap layer 229 overlying the ILD layer 228 and the included metal elements, e.g., the metal vias 226, although other implementations may omit the ILD cap layers 229. Both the IMD cap layers 223 and the ILD cap layers 229, if present, may be formed of, e.g., a silicon nitride material. In one implementation, shown as a galvanic isolation capacitor 204, a fourth ILD cap layer 229D is formed of an SiN-related material and has openings 231 through the fourth ILD cap layer 229D that isolate the top metal plate 232 from a path to the top-most metal ring 220E through the fourth IDL cap layer 229D, as disclosed in the '697 patent.

A low-voltage node of the galvanic isolation capacitor 204, depicted as a bottom metal plate 230, is disposed in one of the metal levels 218, e.g., a first metal level 218A as depicted in FIG. 2A. A high-voltage node of the galvanic isolation capacitor 204, depicted as a top metal plate 232, is disposed in another metal level, e.g., a fifth metal level 218E as depicted in FIG. 2A. The top metal plate 232 is in contact with the top ILD layer, which in the implementation shown is a fourth ILD cap layer 229D. A first IMD cap layer 223A, a first ILD layer 228A, an optional first ILD cap layer 229A, a second IMD layer 222B, a second IMD cap layer 223B, a second ILD layer 228B, an optional second ILD cap layer 229B, a third IMD layer 222C, a third IMD cap layer 223C, a third ILD layer 228C, an optional third ILD layer 229C, a fourth IMD layer 222D, a fourth IMD cap layer 223D, a fourth ILD layer 228D, and an optional fourth ILD cap layer 229D, each of which is formed between the bottom metal plate 230 and the top metal plate 232, provide a capacitor dielectric 236 of the galvanic isolation capacitor 204. As noted previously, a thickness 238 of the capacitor dielectric 236 may be determined by a desired operating voltage of the top metal plate 232 relative to the bottom metal plate 230 and/or the semiconductor substrate 202. In one example in which the galvanic isolation capacitor 104 is designed to operate at a differential of 1000 volts, the capacitor dielectric 236 may have a thickness 238 of about 16-20 microns.

Figure 2B:
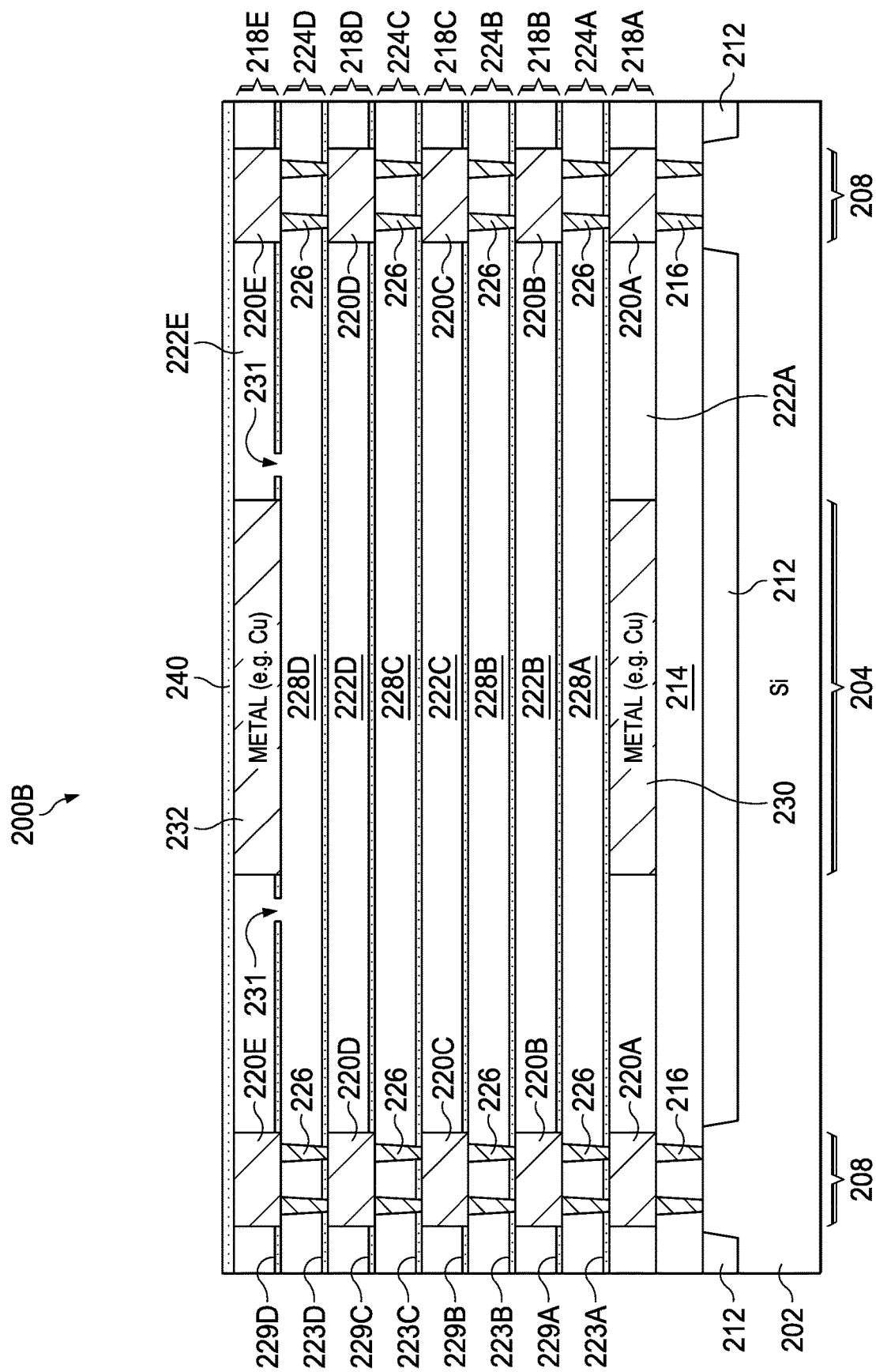

FIG. 2B illustrates a section view of a microelectronic device 200B on which a dielectric liner 240 has been formed over the microelectronic device 200A. The dielectric liner 240 is formed over the top-level metal, e.g., the top metal plate 232, the top-most metal ring 220E, and exposed portions of the top dielectric layer, e.g., fifth IMD layer 222E. In one implementation, the dielectric liner 240 includes a SiN-related material, e.g., silicon nitride, silicon oxynitride, silicon-rich silicon nitride, silicon-rich silicon oxynitride, silicon oxide carbide nitride and silicon carbide nitride, and may have a thickness in the range, e.g., of 0.5-2 μm.

Figure 2C:
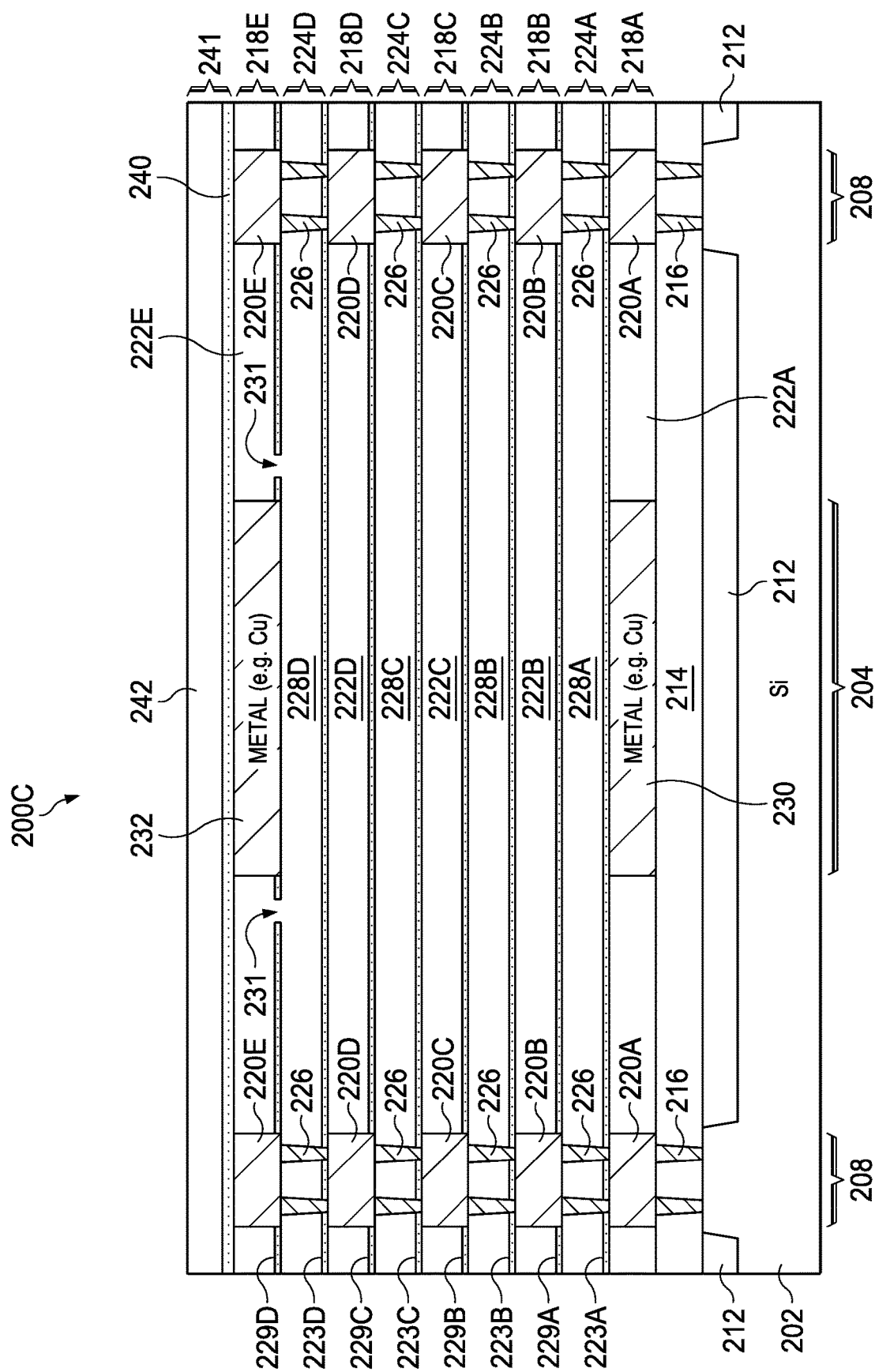

FIG. 2C illustrates a section view of a microelectronic device 200C after a dielectric overcoat 242 is formed over the dielectric liner 240 of the microelectronic device 200B. In one implementation the dielectric overcoat 242 includes, e.g., SiO2, which may have a thickness in the range, e.g., of 3-4 μm. Together the dielectric liner 240 and the dielectric overcoat 242 form a protective overcoat 241 over the top metal plate 232 and the top-most metal ring 220E of the ground ring 208.

Figure 2D:
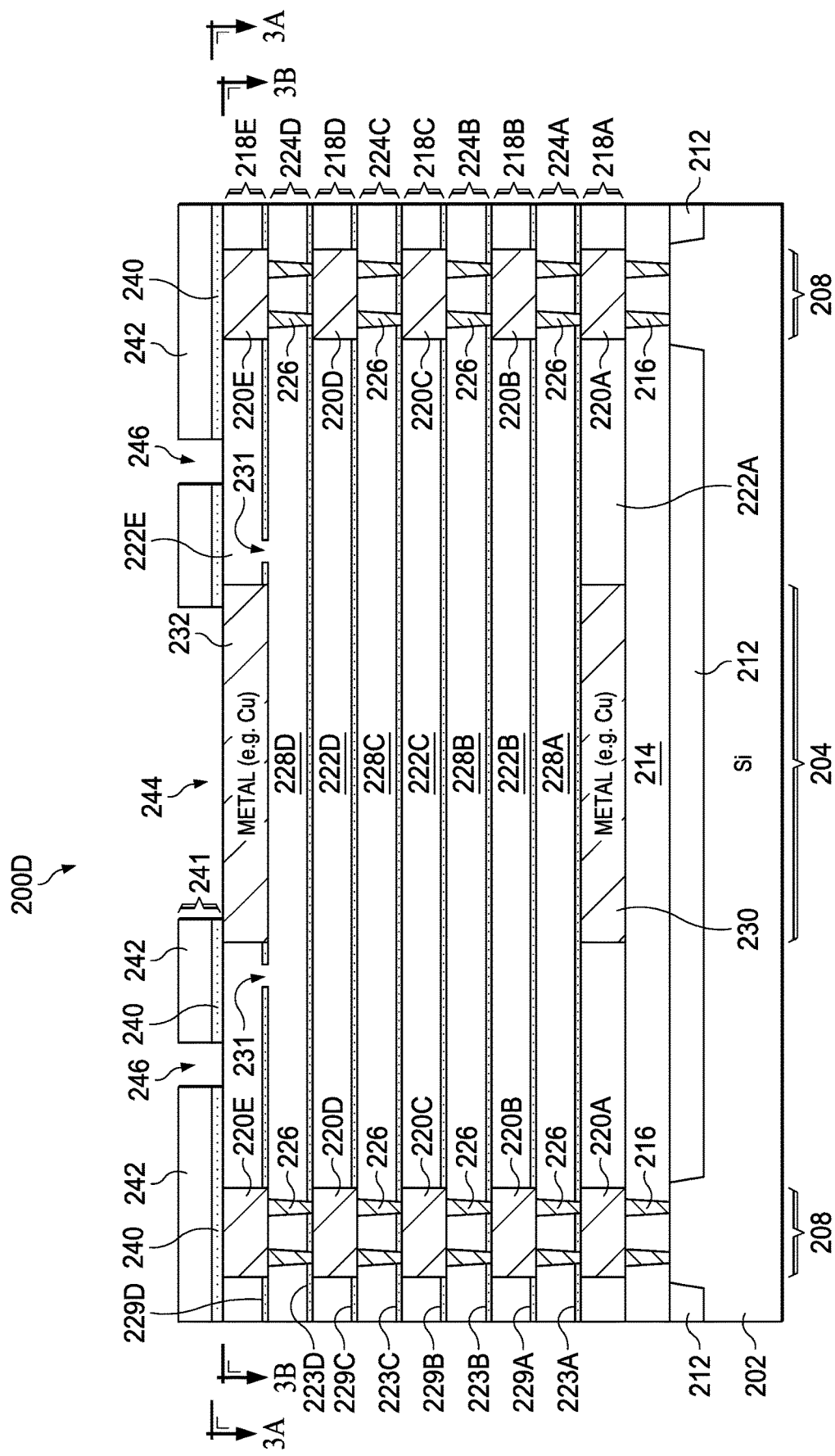

FIG. 2D illustrates a section view of a microelectronic device 200D after the formation of a contact opening 244 and a trench opening 246 on the microelectronic device 200C. The contact opening 244 extends through the protective overcoat 241, e.g., the dielectric overcoat 242 and the dielectric liner 240, and exposes at least a portion of the top metal plate 232. The trench opening 246 also extends through the protective overcoat 241 to expose a top dielectric layer, i.e., a fifth IMD layer 222E; the trench opening 246 surrounds the top metal plate 232 and isolates the top metal plate 232 from a potential electrical path to the top-most metal ring 220E. Although the trench opening 246 is formed in this example at the same time as the contact opening 244 and extends through both the dielectric overcoat 242 and the dielectric liner 240 to contact fifth dielectric layer 222E, in a different production flow, the trench opening 246 could be formed through the dielectric liner 240 prior to the deposition of the dielectric overcoat 242 and serve the same purpose.

Figure 3A:
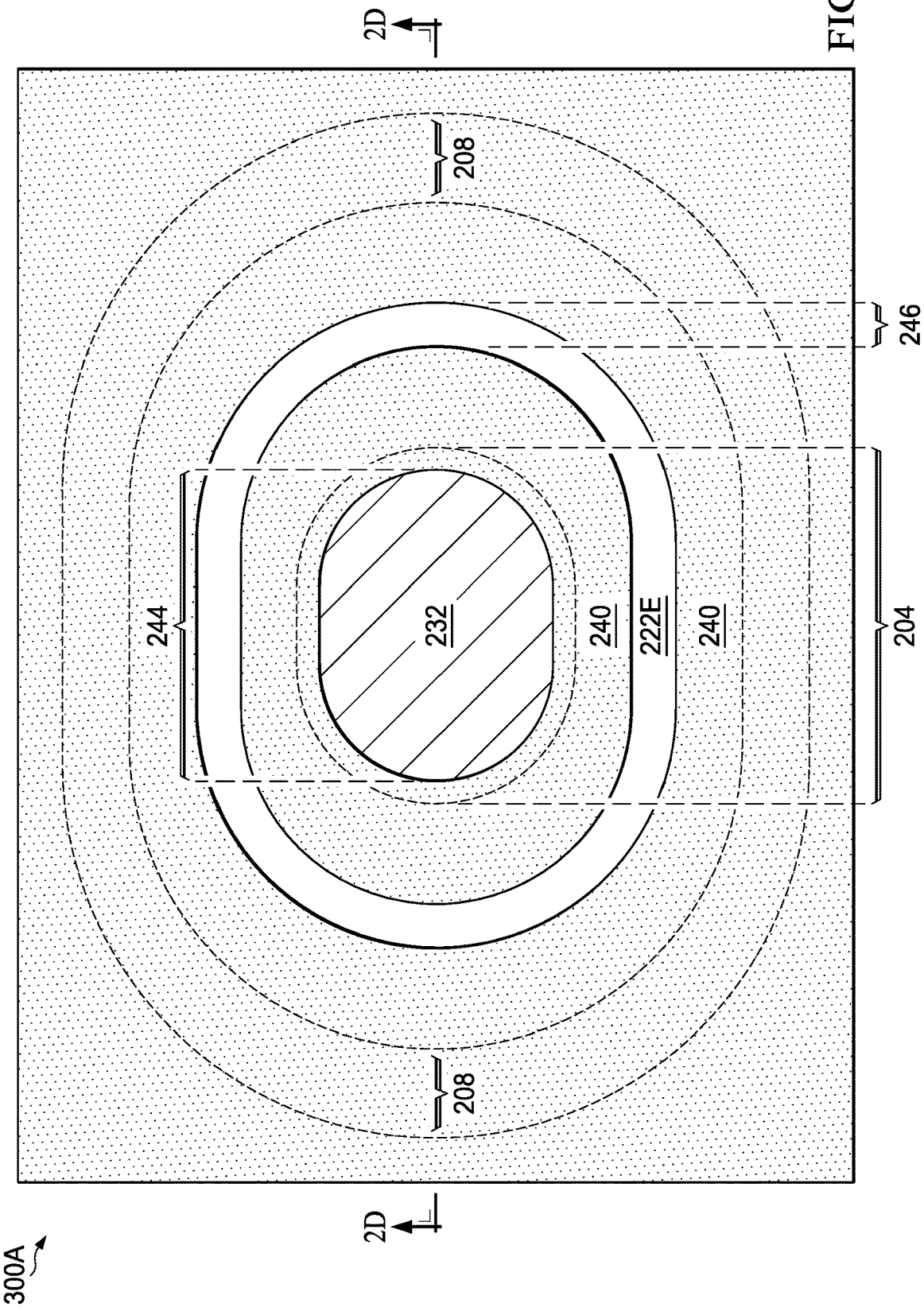
FIG. 3A and FIG. 3B illustrates top views of the device of FIG. 2D taken at respective locations as marked in FIG. 2D.

FIG. 3A illustrates a top view of a microelectronic device 300A that corresponds to microelectronic device 200D. The view in FIG. 3A is taken at a first location that lies at the level of the dielectric liner 240, as marked in FIG. 2D. The dielectric liner 240 extends across the microelectronic device 200D with two openings extending therethrough. Contact opening 244 extends through the dielectric liner 240 to expose the top metal plate 232. The dotted line surrounding the exposed portions of the top metal plate 232 illustrates the outer boundary of the top metal plate 232 and thus the full size of the galvanic isolation capacitor 204. The location of the ground ring 208 in the underlying layer is shown by dotted lines. Although each of the top metal plate 232, the trench opening 246, and the ground ring 208 are shown in these figures as generally elliptical, these specific shapes are for illustration only and other shapes are within the scope of this disclosure. In particular, the ground ring 208 may substantially surround more than one high-voltage isolation component and may thus have different and more complex shapes. Additionally, although the ground ring 208 is shown as a continuous element, the ground ring 208 may be discontinuous, with a small cut in the "ring". The ground ring 208 an be understood as simply a grounded metal structure that substantially surrounds one or more high-voltage capacitors. Further, when the ground ring 208 substantially surrounds multiple high-voltage components, the trench opening 246 may also have a more complex shape.

Figure 3B:
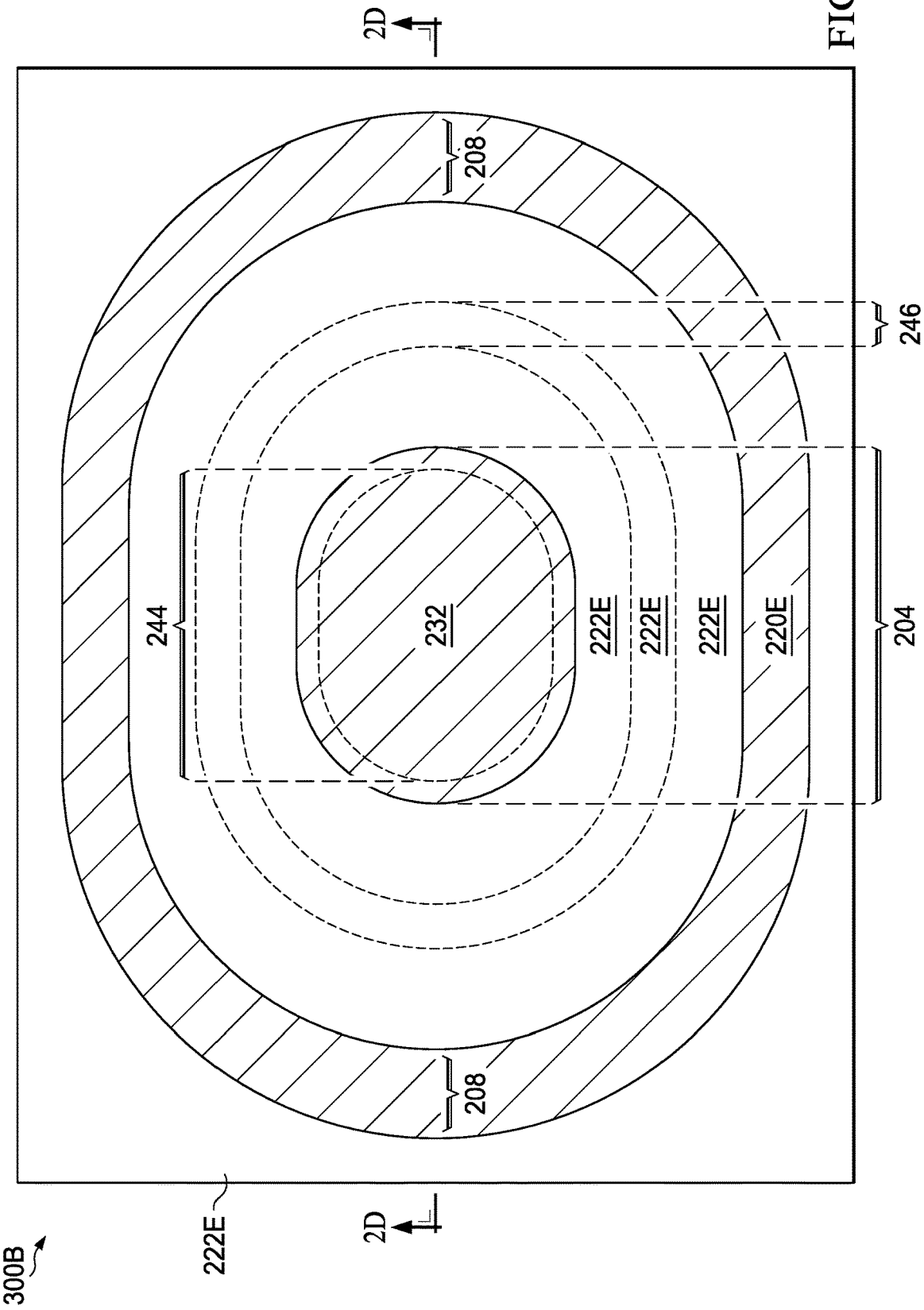

FIG. 3B illustrates a top view of a microelectronic device 300B that also corresponds to the microelectronic device 200D. The view in FIG. 3B is taken at a second location that lies at the top metal level 218E, as marked in FIG. 2D. The fifth IMD layer 222E extends across most of the microelectronic device 200D at this level, although all of the top metal plate 232 and the top-most metal ring 220E of the ground ring 208 are now exposed. The location of the contact opening 244 and the trench opening 246, which were visible in the previous level, are shown by respective dotted lines.

Figure 4:
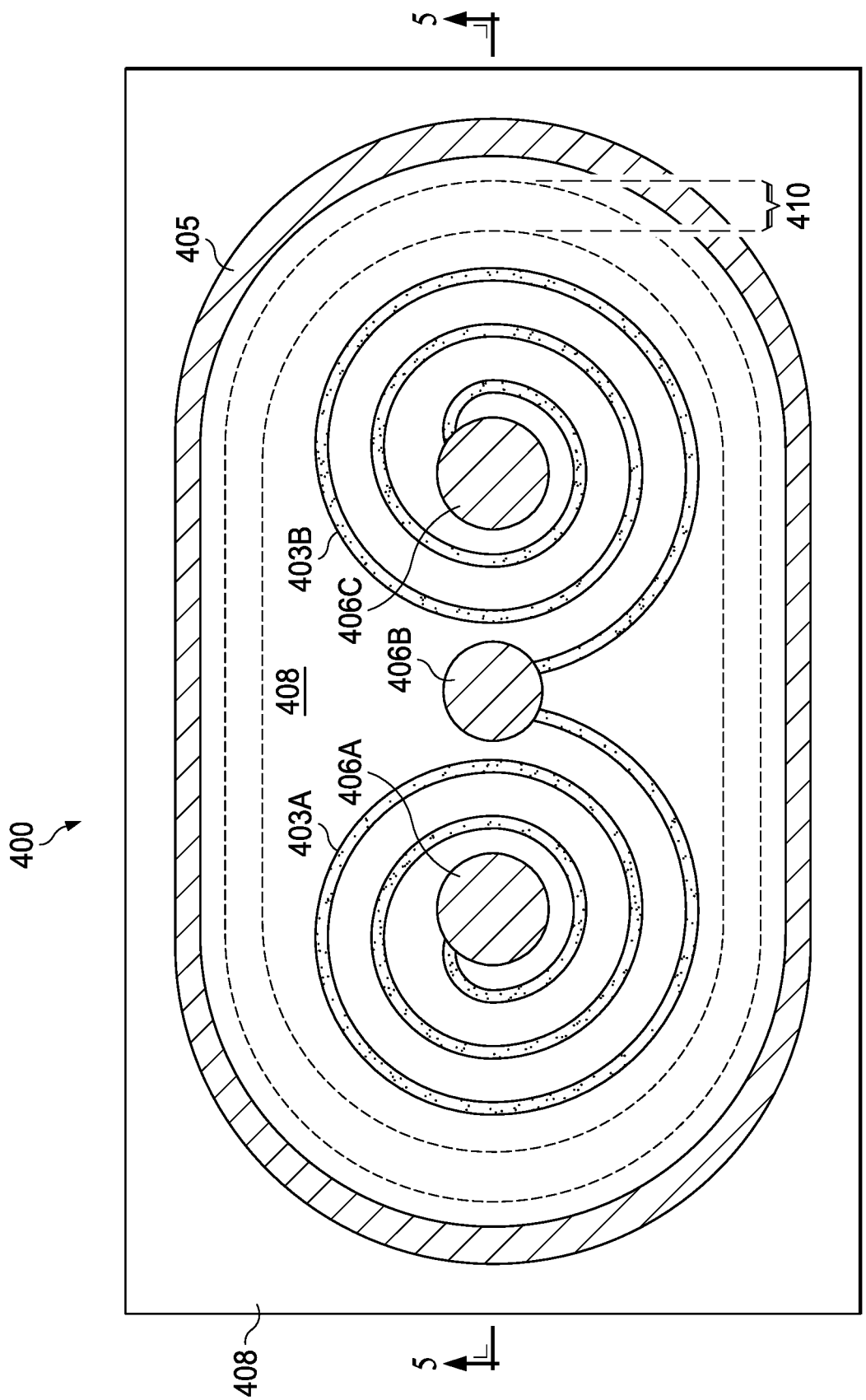
FIG. 4 illustrates a top view of a galvanic isolation transformer according to an implementation of the disclosure.

FIG. 4 illustrates a top view of a microelectronics device 400 that includes an isolation device. In one implementation, the isolation device includes a first top metal coil 403A and a second top metal coil 403B, which together form the upper level of a transformer. Top metal coils 403 are configured to operate at a high voltage with respect to the rest of the isolation device and are substantially surrounded by a top metal ring 405 that forms part of a ground ring. The top metal ring 405 is configured to operate at a low voltage, e.g., ground. In one implementation, the top metal coils 403 and the top metal ring 405 are formed of copper by damascene process and are located within the top-level metal layer of microelectronics device 400, although formation of microelectronics device 400 using another metal, e.g., aluminum, and subtractive etching is within the scope of the present application.

Three metal contact points 406 are also part of the top metal layer of the microelectronics device 400. The first top metal coil 403A has a first end disposed inside the first top metal coil 403A and a second end disposed on an outer perimeter of the first top metal coil 403A; the first end of first top metal coil 403A is coupled to a first metal contact point 406A and the second end is coupled to a second metal contact point 406B. The second top metal coil 403B has a first end disposed inside the second top metal coil 403B and a second end disposed on an outer perimeter of the second top metal coil 403B; the first end of the second top metal coil 403B is coupled to a third metal contact point 406C and the second end is coupled to the second metal contact point 406B. A top dielectric layer 408 is disposed across the microelectronics device 400 and between the top metal coils 403 and the top metal ring 405. Although a dielectric liner and a dielectric overcoat (not specifically shown) are provided, the top view of FIG. 4 is taken at the level of the top metallization layer, as will be seen in the following figure. The location of a trench opening 410 that lies between the top metal coils 403 and the top metal ring 405 and that exposes the top-level IMD 408 is shown by dotted lines.

Figure 5:
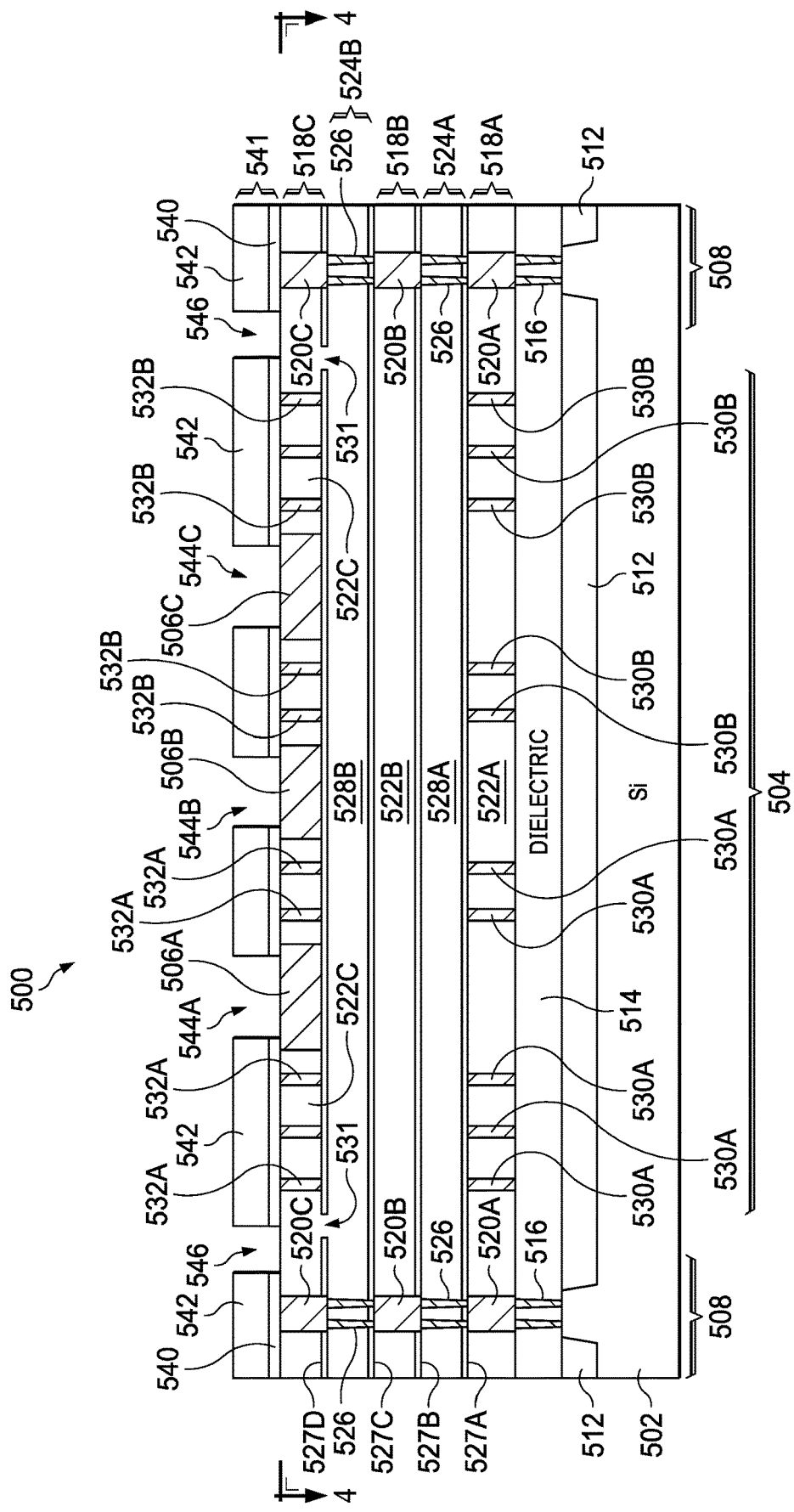
FIG. 5 illustrates a section view of the galvanic isolation transformer of FIG. 4 according to an implementation of the disclosure.

FIG. 5 illustrates a section view of a microelectronic device 500 that corresponds to the microelectronic device 400. In one implementation, the microelectronics device 500 is a 3-level metal (3LM) damascene device. The microelectronic device 500 is formed on a semiconductor substrate 502, e.g., a silicon wafer. The microelectronic device 500 includes a high-voltage component, which in the implementation shown is a galvanic isolation transformer 504, and a ground ring 508. In the example shown in the microelectronic device 500, the ground ring is coupled to the semiconductor substrate 502 and operates at a low-voltage. The microelectronic device 500 may also include low-voltage circuitry (not specifically shown) that operates outside of the ground ring 508. As was previously mentioned with regard to isolation capacitors, the ground ring 508 may enclose more than one high-voltage component, may have a small discontinuity, and may assume more complex shapes than is shown.

A field oxide or a trench isolation 512 may be formed in the semiconductor substrate 502 (e.g., near or adjacent to a top surface of the substrate) to laterally isolate elements of the microelectronic device 500. A pre-metal dielectric (PMD) layer 514 is formed over the semiconductor substrate 502 including over any FOX layer or trench isolation regions 512 formed prior to the deposition of subsequent metal levels 518. Contacts 516 are disposed through the PMD layer 514 to provide electrical connections for the ground ring 508, as well as other components or circuit portions (not specifically shown) that may be provided in the microelectronic device 500.

Metal levels 518 are disposed over the PMD layer 514. The metal levels 518 include a series of metal rings 520 (or other shapes) and, at appropriate levels, will also include elements of the transformer 504, as discussed below. The metal levels 518 may also include additional components, devices or circuit portions (not specifically shown) that are outside of the ground ring 508. In each metal level 518, IMD layers 522, which in one implementation are of silicon dioxide-based dielectric material, are disposed between the metal rings 520 and elements of the galvanic isolation transformer 504. Respective via levels 524 are disposed between the metal levels 518. The via levels 524 may include metal vias 526 connecting the metal rings 520 and may further include additional vias (not specifically shown) outside of the ground ring 508. The series of metal rings 520 and respective vias are coupled together and to the semiconductor substrate 502 through respective contacts 516 to form the ground ring 508. The ground ring 508 thus forms a low-voltage component around a high-voltage top metal coil 532.

In each via level 524, the metal vias 526 are disposed through ILD layers 528, which in one implementation are of silicon dioxide-based dielectric material. Other dielectric materials for the IMD layers 522 and the ILD layers 528, such as low-k materials, are within the scope of the instant application. In one implementation, the IMD layers 522 and the ILD layers 528 include cap layers 527 of a different dielectric material, which can be used as a barrier layer and/or etch stop. In one implementation, the cap layers 527 include a silicon nitride material. In one implementation, the IMD layers 522 can be part of the corresponding ILD layers 528, depending on the process sequence used to form the plurality of metal levels 518.

A low-voltage node of the galvanic isolation transformer 504, depicted as individual segments of a first lower metal coil 530A and a second lower metal coil 530B, is disposed in one of the metal levels 518, e.g., a first metal level 518A as depicted in FIG. 5. A high-voltage node of the galvanic isolation transformer 504, depicted as individual segments of a first top metal coil 532A and a second top metal coil 532B, is disposed in another metal level, e.g., a top metal level 518C as depicted in FIG. 5. A first metal contact point 506A, a second metal contact point 506B, and a third metal contact point 506C are also disposed in the top metal level 518C. The first top metal coil 532A, the second top metal coil 532B, the first metal contact point 506A, the second metal contact point 506B, the third metal contact point 506C, and the top-most metal ring 520C are each in contact with the top dielectric layer, which in the implementation shown is a third or top-level IMD layer 522C. A first IMD cap layer 527A, a first ILD layer 528A, an optional first ILD cap layer 527B, a second IMD layer 522B, a second IMD cap layer 527C, a second ILD layer 528B, and an optional second ILD cap layer 527D provide a transformer dielectric for the galvanic isolation transformer 504, with the thickness of the transformer dielectric determined by the voltage at which the galvanic isolation transformer 504 will operate. In one implementation in which the optional first ILD cap layer 527B and the optional second ILD cap layer 527D are present, the second ILD cap layer 527D is formed of a silicon nitride material and has openings 531 through the second ILD cap layer 527D that isolate the top metal coils 532 from a path to the top-most metal ring 520C through the second ILD cap layer 527D, as disclosed in the '697 patent.

A dielectric liner 540 has been formed over the top-level metal, e.g., the top metal coils 532, the metal contact points 506, the top-most metal ring 520C, and exposed portions of the top dielectric level, e.g., top-level IMD layer 522C. In one implementation, the dielectric liner 540 includes a SiN-related material, e.g., silicon nitride, silicon oxynitride, silicon-rich silicon nitride, silicon-rich silicon oxynitride, silicon oxide carbide nitride, and silicon carbide nitride. A dielectric overcoat 542 has also been formed over the dielectric liner 540. In one implementation the dielectric overcoat 542 includes silicon dioxide or a related material. The dielectric liner 540 and the dielectric overcoat 542 form a protective overcoat 541 over the top metal coils 532, the metal contact points 506, and the top-most metal ring 520C of the ground ring 508. The protective overcoat 541 can range between about 1 micron and about 15 microns in thickness.

Contact openings 544 and a trench opening 546 have been formed through the protective overcoat 541. A first contact opening 544A, a second contact opening 544B, and a third contact opening 544C extend through the protective overcoat 541 and expose at least a portion of the first metal contact point 506A, the second metal contact point 506B, and the third metal contact point 506C respectively. The trench opening 546 also extends through the protective overcoat 541 to expose the top-level IMD layer 522C; the trench opening 546 also surrounds the top metal coils 532 and isolates the top metal coils 532 from a lateral path to the top-most metal ring 520C through the dielectric liner 540.

Again, because the contact openings 544 and the trench opening 546 are generally formed at the same time, the trench opening 546 extends through both the dielectric liner 540 and the dielectric overcoat 542 to contact the top dielectric layer, e.g., third IMD layer 522C. However, in a production flow that allows the trench opening 546 to be formed at a different point in the production flow than the contact openings 544, forming the trench opening 546 only through the dielectric liner 540 would serve the goal of laterally isolating the top metal coils 532 from the top-most metal ring 520C.

FIG. 6 provides a flowchart depicting a process 600 of forming an integrated circuit. Except where an element of process 600 refers to a structure formed in another element of process 600, the elements are not necessarily shown in a particular order. The process 600 begins with forming 605 a metal isolation element over a substrate, e.g., in a top IMD level or on a top ILD level. The substrate can be a semiconductor wafer, e.g., of silicon. The metal isolation element can be a top capacitor plate, e.g., the top metal plate 132 (FIG. 1A) or the top metal plate 232 (FIG. 2A). The metal isolation element can also be a top metal coil, e.g., top metal coils 532 (FIG. 5) with the metal contact points 506. The process also forms 610 a metal ring substantially surrounding the metal isolation element.

Once these layers have been formed, a protective overcoat is formed 615 over the metal isolation element; the protective overcoat also extends over the metal ring. As shown in the disclosed implementations, the protective overcoat can include a layer formed of an SiN-related material. The SiN-related material can be, e.g., silicon nitride, silicon oxynitride, silicon-rich silicon nitride, silicon-rich silicon oxynitride, silicon oxide carbide nitride, and/or silicon carbide nitride.

Finally a trench opening is formed 620, which extends through the protective overcoat. The trench opening surrounds the metal isolation element and exposes a top dielectric layer in a ring between the metal isolation element and the metal ring. Whether the SiN-related material is provided in a dielectric liner or in a dielectric overcoat that may be part of the protective overcoat, in extreme conditions, e.g., a voltage spike much greater than the integrated circuit is designed for, the SiN-related material can break down and can allow a large current to flow between voltage nodes, causing destruction of the integrated circuit. By creating a gap in the SiN-related material, the lateral path for voltage discharge can be suppressed, providing greater protection from such high-voltage events.

FIG. 6A through FIG. 6H provide greater details regarding the elements featured in the process 600. In FIG. 6A, forming the metal isolation element and forming the metal ring include forming 630 a layer of aluminum using subtractive etching. FIG. 6B further defines that forming the protective overcoat includes forming 635 a dielectric liner over the metal isolation element, the dielectric liner extending over the metal ring and forming 640 a dielectric overcoat on the dielectric liner, the dielectric overcoat including a layer of a SiN-related material. The SiN-related material may be selected from the group consisting of silicon nitride, silicon oxynitride, silicon-rich silicon nitride, silicon-rich silicon oxynitride, silicon oxide carbide nitride and silicon carbide nitride.

FIG. 6C further defines that forming the metal isolation element and forming the metal ring include forming 645 a layer of copper using damascene process. FIG. 6D further defines that forming the protective overcoat includes forming a dielectric liner over the metal isolation element, in which the dielectric liner extends over the metal ring and includes a layer of a SiN-related material, and forming 655 a dielectric overcoat on the dielectric liner. The SiN-related material may be selected from the group consisting of silicon nitride, silicon oxynitride, silicon-rich silicon nitride, silicon-rich silicon oxynitride, silicon oxide carbide nitride and silicon carbide nitride.

FIG. 6E defines that the metal isolation element is an upper isolation element and further includes forming 660 a lower metal isolation element between the upper metal isolation element and the substrate. It will be understood that forming the lower metal isolation element is performed prior to forming the upper metal isolation element. The lower metal isolation element, which can be a lower capacitor plate, e.g., the bottom metal plate 130 (FIG. 1A) or the bottom metal plate 230 (FIG. 2A), and can also be a lower transformer coil, e.g., the first lower metal coil 530A or the second lower metal coil 530B (FIG. 5). The lower metal isolation element can be formed on any appropriate ILD layer or in any appropriate IMD layer that lies between the upper metal isolation element and the substrate, depending on the metal used in the process.

FIG. 6F further defines that each of forming the upper metal isolation element and forming the lower metal isolation element includes forming 665 metal plates. In contrast, FIG. 6G further defines that each of forming the upper metal isolation element and forming the lower metal isolation element includes forming 670 metal coils. FIG. 6H further defines that forming the metal ring includes conductively coupling 675 the metal ring to the substrate. The metal ring, e.g., the metal ring 120E (FIG. 1A), the metal ring 220E (FIG. 2A), or the metal ring 520C (FIG. 5), is coupled to the substrate through intervening metal rings, e.g., the metal rings 120 (FIG. 1A), the metal rings 220 (FIG. 2A), or the metal rings 520 (FIG. 5), the intervening metal vias, e.g., the metal vias 126 (FIG. 1A), the metal vias 226 (FIG. 2A), or the metal vias 526 (FIG. 5), and contacts, e.g., the contacts 116 (FIG. 1A), the contacts 216 (FIG. 2A), or the contacts 516 (FIG. 5).

Applicants have disclosed an integrated circuit that includes a galvanic isolation element, such as a capacitor or a transformer. A dielectric liner is formed in contact with an upper metal isolation element, e.g., a top metal plate or a top metal coil, and also in contact with a top-most metal ring that is part of a ground ring. A dielectric overcoat is formed over the dielectric liner, with either the dielectric liner or the dielectric overcoat containing a silicon nitride-related material. A trench opening is formed through the dielectric liner and the dielectric overcoat, with the trench opening surrounding the upper metal isolation element between the upper metal isolation element and the top-most metal ring and may beneficially increase the ability of the integrated circuit to withstand extremely high transient voltages.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. An integrated circuit, comprising;
   a semiconductor substrate;
   a plurality of dielectric layers over the semiconductor substrate, including a top dielectric layer;
   a metal plate over the top dielectric layer;
   a metal ring over the top dielectric layer and substantially surrounding the metal plate;
   a protective overcoat directly vertically overlying the metal ring and overlying the metal plate; and
   a trench opening through the protective overcoat, the trench opening exposing the top dielectric layer between the metal plate and the metal ring, the trench opening substantially surrounding the metal plate.

2. The integrated circuit of claim 1 in which the metal plate and the metal ring are formed of aluminum and are located on the top dielectric layer.

3. The integrated circuit of claim 2 in which the protective overcoat includes a dielectric liner overlying the metal ring and overlying the metal plate, and a dielectric overcoat located on the dielectric liner, the dielectric overcoat including a silicon nitride-related material selected from the group consisting of silicon nitride, silicon oxynitride, silicon-rich silicon nitride, silicon-rich silicon oxynitride, silicon oxide carbide nitride, and silicon carbide nitride.

4. The integrated circuit of claim 1 in which the metal plate and the metal ring include copper and are located within the top dielectric layer.

5. The integrated circuit of claim 4 in which the protective overcoat includes a dielectric liner overlying the metal ring and overlying the metal plate and a dielectric overcoat located on the dielectric liner, the dielectric liner including a first silicon nitride-related material that is selected from the group consisting of silicon nitride, silicon oxynitride, silicon-rich silicon nitride, silicon-rich silicon oxynitride, silicon oxide carbide nitride, and silicon carbide nitride.

6. The integrated circuit of claim 1 in which the metal ring is conductively connected to the semiconductor substrate; the metal plate is a top metal plate; and the integrated circuit includes a bottom metal plate located directly between the top metal plate and the semiconductor substrate.

7. The integrated circuit of claim 1 including a contact opening through the protective overcoat, the contact opening exposing the metal plate.

8. An integrated circuit, comprising;
   a semiconductor substrate;
   a top metal plate, and a bottom metal plate between the top metal plate and the semiconductor substrate;
   a plurality of dielectric layers between the top and bottom metal plates, including a top dielectric layer under and touching the top metal plate;
   a dielectric protective overcoat that covers the top dielectric layer and extends over the top metal plate; and
   a trench opening that surrounds the top metal plate and extends through the dielectric protective overcoat and stops on the top dielectric layer.

9. The integrated circuit of claim 8, further comprising a ground ring that substantially surrounds the top and bottom metal plates, the ground ring including a top metal ring over and touching the top dielectric layer, the trench opening between the top metal plate and the top metal ring.

10. The integrated circuit of claim 9, wherein the ground ring is electrically connected to the semiconductor substrate between first and second trench isolation regions.

11. The integrated circuit of claim 8, wherein the bottom metal plate includes aluminum.

12. The integrated circuit of claim 8, wherein the dielectric protective overcoat includes silicon and nitrogen.

13. The integrated circuit of claim 8, wherein the dielectric protective overcoat includes a dielectric liner and a dielectric overcoat over the dielectric liner, the dielectric overcoat comprising silicon nitride.

14. The integrated circuit of claim 8, wherein the top and bottom metal plates are vertically spaced apart by 14-18 µm.

15. The integrated circuit of claim 8, wherein the plurality of dielectric layers includes a plurality of silicon oxide layers.

16. An integrated circuit, comprising:
a semiconductor substrate;
a top metal plate, and a bottom metal plate between the top metal plate and the semiconductor substrate;
a plurality of dielectric layers between the top and bottom metal plates, including a top dielectric layer under and touching the top metal plate;
a metal ring over and touching the top dielectric layer, the metal ring substantially surrounding the top metal plate;
a dielectric protective overcoat that covers the top dielectric layer and extends over the top metal plate and over the metal ring; and
a trench opening between the top metal plate and the metal ring, the trench opening extending through the dielectric protective overcoat.

17. The integrated circuit of claim 16, wherein the trench opening surrounds the top metal plate.

18. The integrated circuit of claim 16, wherein the trench opening stops on the top dielectric layer.

19. The integrated circuit of claim 16, wherein the metal ring is a top metal ring of a stacked ground ring structure that is electrically connected to the semiconductor substrate.

20. The integrated circuit of claim 19, wherein the metal ring is electrically connected to the semiconductor substrate between first and second dielectric isolation regions.

21. The integrated circuit of claim 16, wherein the dielectric protective overcoat includes a dielectric liner between a dielectric overcoat and the top dielectric layer.

22. The integrated circuit of claim 21, wherein the dielectric liner includes silicon oxide and the dielectric overcoat comprises silicon and nitrogen.

23. The integrated circuit of claim 22, wherein the dielectric overcoat is selected from the group consisting of silicon nitride, silicon oxynitride, silicon-rich silicon nitride, silicon-rich silicon oxynitride, silicon oxide carbide nitride, and silicon carbide nitride.

* * * * *